United States Patent [19]
Anthony et al.

[11] 3,979,230

[45] *Sept. 7, 1976

[54] METHOD OF MAKING ISOLATION GRIDS IN BODIES OF SEMICONDUCTOR MATERIAL

[75] Inventors: Thomas R. Anthony; Harvey E. Cline, both of Schenectady, N.Y.

[73] Assignee: General Electric Company, Schenectady, N.Y.

[ * ] Notice: The portion of the term of this patent subsequent to Sept. 9, 1992, has been disclaimed.

[22] Filed: Nov. 1, 1974

[21] Appl. No.: 519,913

Related U.S. Application Data

[63] Continuation-in-part of Ser. No. 411,022, Oct. 30, 1973, Pat. No. 3,904,442.

[52] U.S. Cl. ............................... 148/1.5; 148/171; 148/172; 148/187; 148/175; 148/177; 148/179; 252/62.3 GA; 252/62.3 E; 357/48
[51] Int. Cl.² ..................................... H01L 21/228
[58] Field of Search ............ 148/1.5, 171, 172, 173, 148/186, 187, 188, 175, 177, 179; 252/62.3 GA, 62.3 E; 357/48

[56] References Cited
UNITED STATES PATENTS

| | | | |
|---|---|---|---|
| 2,813,048 | 11/1957 | Pfann | 148/1 |
| 3,333,166 | 7/1967 | Hochman | 357/48 |
| 3,560,278 | 2/1971 | Sanera | 148/187 |
| 3,904,442 | 9/1975 | Anthony et al. | 148/1.5 |

OTHER PUBLICATIONS

Gansauge, "Junction Isolation in Germanium by Alloy Process", *IBM Technical Disclosure*, vol. 9, No. 6, Nov. 1966, p. 697.

*Primary Examiner*—G. Ozaki
*Attorney, Agent, or Firm*—Donald M. Winegar; Joseph T. Cohen; Jerome C. Squillaro

[57] ABSTRACT

An isolation grid is produced by the migration of a metal-rich liquid zone of material through a body of semiconductor material. Planar orientation of the surface through which migration is initiated, directions of wire alignment in the surface, wire sizes, direction of wire migration and simultaneous migration of intersecting liquid wires are disclosed herein. P-N junctions of the grid produced behind the migrated wires have substantially ideal voltage breakdown characteristics.

47 Claims, 10 Drawing Figures

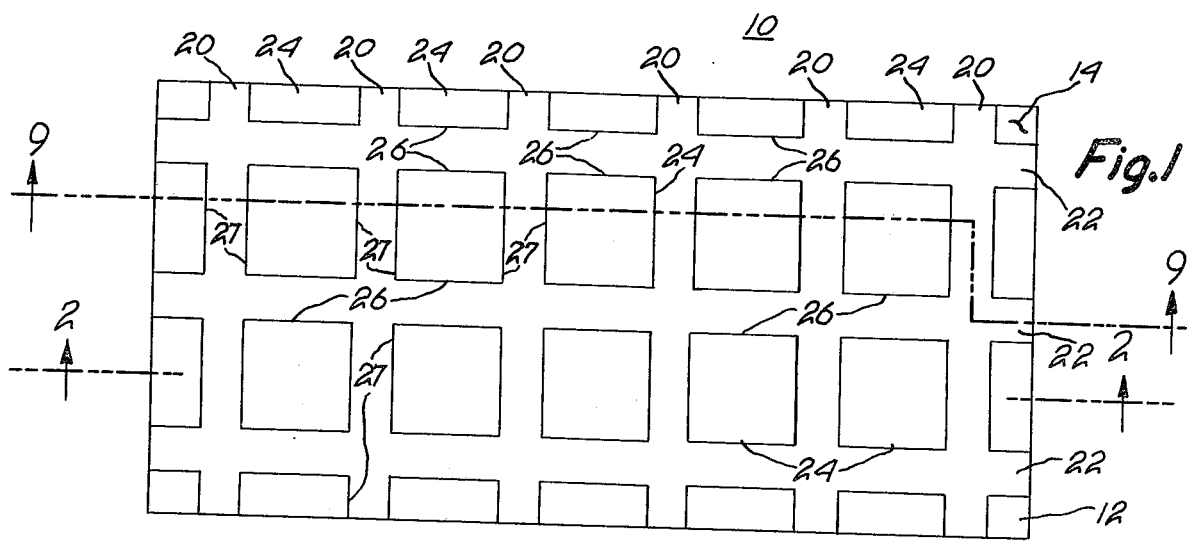
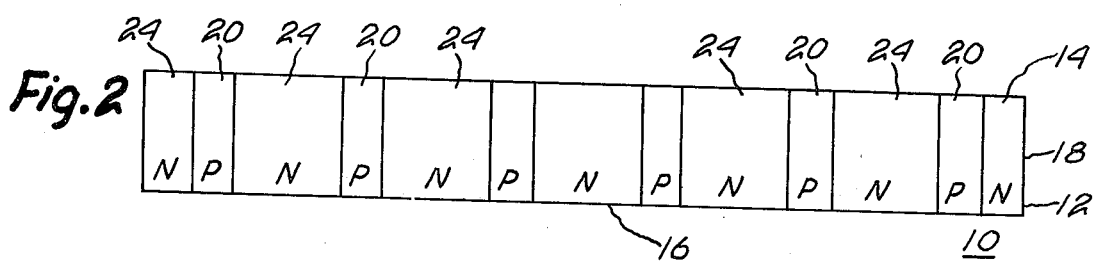
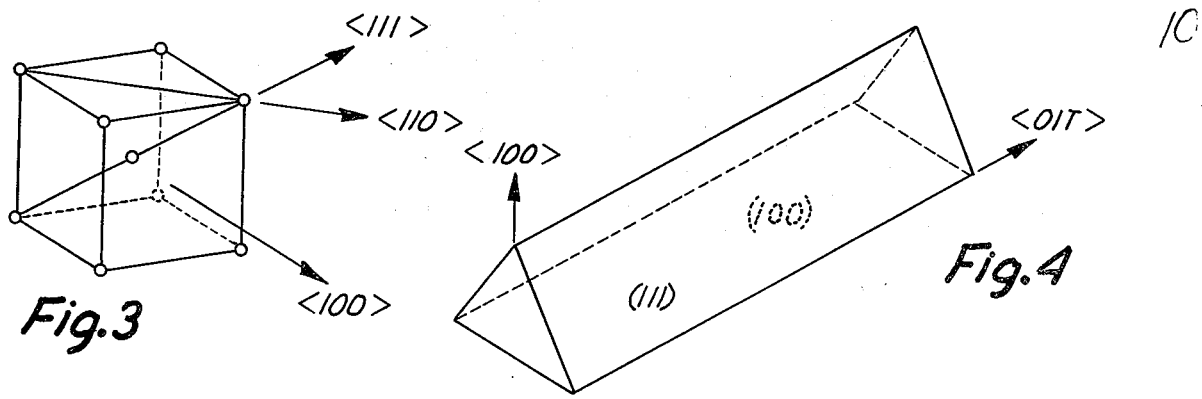
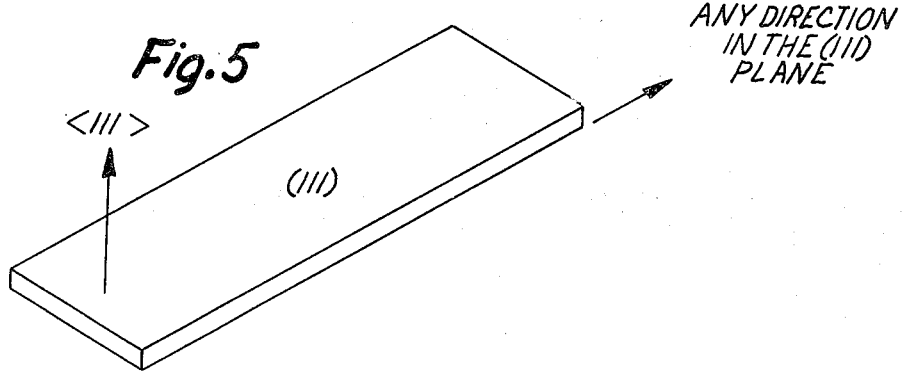

METHOD OF MAKING ISOLATION GRIDS IN BODIES OF SEMICONDUCTOR MATERIAL

CROSS-REFERENCE TO RELATED PATENT APPLICATION

This invention is a continuation-in-part of our patent application, Ser. No. 411,022, filed Oct. 30, 1973, now issued U.S. Pat. No. 3,904,442 and assigned to the same assignee as the present invention.

BACKGROUND OF THE INVENTION

1. Field of the Invention

This invention relates to P-N junction isolation grids for semiconductor devices and method of making the same.

2. Description of the Prior Art

W. G. Pfann describes in "Zone Melting", John Wiley and Sons, Inc. New York (1966), a thermal gradient zone melting process to produce P-N junctions within the bulk of a semiconductor. In his method, either sheets or wires of a suitable metallic liquid are moved through a semiconductor material in a thermal gradient. Doped liquid-epitaxial material is left behind as the liquid wire migration progresses. However, several investigators found the planar liquid zone was unstable and droplets of liquid broke away from the zone and were trapped in the recrystallized material. Thus, material produced by TGZM was not suitable for the manufacture of semiconductor devices. No real success was ever achieved in any of these efforts to the best of our knowledge and no commercially feasible adaptation of TGZM exists elsewhere today. Earlier efforts used relatively thick liquid zones because of the ease in placing a metal foil in between two semiconductor crystals. Problems of wetting and instability of the zone were recognized but no solution was found. In addition, observation of the crystal produced showed trapped liquid and unstable migration.

In our copending applications:

High Velocity Thermomigration Method of Making Deep Diodes, Ser. No. 411,015 now U.S. Pat. No. 3,898,106; Deep Diode Device and Method, Ser. No. 411,009 now U.S. Pat. No. 3,902,925; Deep Diode Device and Method, Ser. No. 411,001, now abandoned in favor of Ser. No. 552,154; Method of making Deep Diode Devices, Ser. No. 411,150 now U.S. Pat. No. 3,901,736; High Velocity Thermal Migration Process of Making Deep Diodes, Ser. No. 411,021, now U.S. Pat. No. 3,910,801; and Stabilized Droplet Migration Method of Making Deep Diodes Having Uniform Electrical Properties, Ser. No. 411,008 now U.S. Pat. No. 3,899,361; assigned to the same assignee of this application, we teach the stability of droplets, planar zones and line migrations and critical dimensions affecting the migration thereof. However, we have found that even with this available knowledge the formation of a P-N junction isolation grid is not a simple adaptation of the available knowledge we had developed.

Therefore, it is an object of this invention to provide a new and improved method of manufacturing a P-N junction isolation grid for semiconductor devices.

Another object of this invention is to provide a new and improved method for manufacturing a P-N isolation grid for semiconductor devices which correlates planar orientation of the surface of the semiconductor materials, directions of wires as disposed on the surface and the direction of the migration of the wires relative to the crystallography of the semiconductor material.

Other objects of this invention will, in part, be obvious and will, in part, appear hereinafter.

BRIEF DESCRIPTION OF THE INVENTION

In accordance with the teachings of this invention, there is provided a method for making a P-N junction isolation grid in a body of semiconductor material. The grid is comprised of a first group of planar regions, each of which are substantially parallel to each other and disposed a predetermined distance apart from each other and a second group of planar regions which are substantially parallel to each other, disposed a predetermined distance apart from each other and disposed at a preselected angle to at least one of the planar regions of the first group. The method comprises the process steps of disposing a first array of metal wires on a selected surface of a body of semiconductor material having a selected resistivity, a selected conductivity and a preferred planar crystal orientation. The vertical axis of the body is substantially aligned with a first axis of the crystal structure. The direction of the metal wires is oriented to substantially coincide with at least one of the other axes of the crystal structure. The body is heated to a temperature sufficient to form an array of liquid wires of metal-rich material on the surface of the body. A temperature gradient is established along substantially the vertical axis of the body and the first axis of the crystal structure. The array of metal-enriched semiconductor material is migrated through the body along the first axis of the crystal structure to form a plurality of planar regions of recrystallized material of the body. The planar regions so formed may be of the same or different type conductivity than that of the body. In a similar manner, a second array of liquid metal-rich material is migrated through the body at a selected angle to the first array to produce a grid like structure in the body. Depending upon the planar orientation of the surface of the body, the orientation of the direction of the metal wires on the surface and the direction of the migration, the grid is produced by simultaneous migration of the intersecting lines or by a plurality of migrations of individual groups of metal wires.

A third array of liquid metal-rich material is migrated through the body in a similar manner to form a grid structure wherein triangular regions of the body are electrically isolated from each other Additionally, a planar region of like conductivity is formed in or on the bottom surface portion of the body to provide individual electrically isolated cells. These are particularly suitable for planar and mesa devices which are contacted from one surface only.

DESCRIPTION OF THE DRAWINGS

FIG. 1 is a top planar view of a P-N junction isolation grid made in accordance with the teachings of the invention;

FIG. 2 is an elevation view in cross-section of the grid of FIG. 1 taken along the cutting plane II—II;

FIG. 3 is a diamond cubic crystal structure;

FIG. 4 is the morphological shape of wires which migrated stably in the < 100 > direction;

FIG. 5 is the morphological shape of wires which migrate stably in the < 111 > direction;

DESCRIPTION OF THE INVENTION

Figure 8:
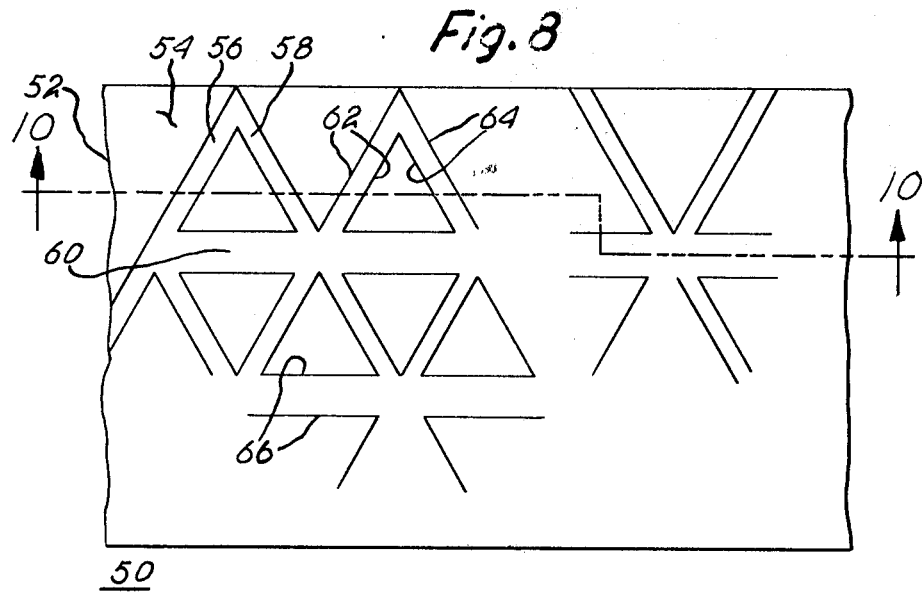
FIG. 8 is an elevation view, in cross-section, of an alternate embodiment of a P-N junction isolation grid made in accordance with the teachings of this invention.

Referring to FIGS. 1 and 2, there is shown a semiconductor device 10 comprising a body 12 of single crystal semiconductor material having a selected resistivity and a first type conductivity. The semiconductor material comprising the body 12 may be silicon, germanium, silicon carbide, or any other semiconductor material preferably having a diamond cubic crystal structure. The body 12 has two major surfaces 14 and 16, which define the top and bottom surfaces thereof respectively, and a peripheral side surface 18.

A plurality of first spaced planar regions 20 are disposed in the body substantially parallel to each other. Preferably, for semiconductor device fabrication, each of the regions 20 is oriented substantially perpendicular to the top and bottom surfaces, 14 and 16, respectively, and the peripheral side surface 18. Each of the regions 20 has a peripheral side surface which is coextensive with the respective surface 14, 16 and 18 of the body 12. A P-N junction 27 is formed by the contiguous surfaces of each region 20 and the immediately adjacent material of the body 12.

A plurality of second spaced planar regions 22 are disposed in the body 12 substantially parallel to each other. Preferably, for semiconductor device fabrication, each of the regions 22 is oriented substantially perpendicular to the respective top and bottom surfaces, 14 and 16 and the side surface 18. In addition, each of the regions 22 is preferably perpendicular to, and intersects one or more of the plurality of first spaced planar regions 20. However, the regions 20 and 22 may be at a preselected angle to each other. Each of the second planar regions 22 has a peripheral side surface which is coextensive with the surfaces 14, 16 and 18 of the body 12. A P-N junction 26 is formed by the contiguous surfaces of each region 22 and the immediately adjacent material of the body 12. The intersecting planar regions 20 and 22 define an egg-crate configuration which divides the body 12 into a plurality of third regions 24 of first type conductivity electrically isolated from each other.

Preferably, each of the regions 20 and 22 are of the same type conductivity, the conductivity being of a second, and opposite type, than that conductivity of the body 12 and the regions 24. Temperature gradient zone melting is the preferred process means for forming the regions 20 and 22 in the body 12. The material of the planar regions 20 and 22 comprises recrystallized material of the body 12 having a concentration of an impurity constituent which imparts the second, and opposite type, conductivity thereto. It is recrystallized material with solid solubility of the impurity therein. It is not a recrystallized material with liquid solubility of the impurity. Neither is it recrystallized material of eutectic. Each of the planar regions 20 and 22 has a substantially uniform resistivity throughout its entire region. The width of each of the regions 20 and 22 is substantially constant over the entire region and is determined by whatever photomasking geometry is used to define the regions 20 and 22. In particular, the body 12 may be of silicon semiconductor material of N-type conductivity and the regions 22 and 24 are aluminum doped recrystallized silicon to form the required P-type conductivity regions. Similarly, the body 12 may be of P-type conductivity and the regions 22 and 24 have material which may be of antimony doped recrystallized material of the body 12.

The P-N junctions 27 and 26 are well defined and show an abrupt transition from one region of conductivity to the next adjacent region of opposite type conductivity. The abrupt transition produces a step P-N junction. Linearly graded P-N junctions 27 and 26 are obtained by a post diffusion heat treatment of the grid structure at a selected elevated temperature.

The plurality of planar regions 20 and 22 electrically isolate each region 24 from all of the remaining regions 24 by the back-to-back relationship of the respective segments of the P-N junctions 27 and 26. The electrical isolation achieved by this novel egg crate design enables one to associate one or more semiconductor devices with one or more of the plurality of regions 24 of first type conductivity. The devices may be planar semiconductor devices 28 formed in mutually adjacent regions 24 and/or mesa semiconductor devices 30 formed on mutually adjacent regions 24 and still protect the electrical integrity of each device 28 or 30 without disturbing the mutually adjacent devices. Devices 28 and 30 may, however, be electrically interconnected to produce integrated circuits and the like.

The spaced planar regions 20 and 22 besides offering excellent electrical isolation between mutually adjacent regions 24 have several other distinct advantages over prior art electrical isolation regions. Each of the regions 20 and 22 have a substantially constant uniform width and a substantially constant uniform impurity concentration for its entire length and depth. In addition, the planar regions 20 and 22 may be fabricated before or after the fabrication of the basic devices 28 and 30. Preferably, the regions 20 and 22 are fabricated after the highest temperature process step necessary for the fabrication of the devices 28 and 30 has been practiced first. This preferred practice limits, or substantially eliminates, any sideways diffusion of the impurity of the regions 20 and 22 which tends to increase the width of the regions 20 and 22 and thereby decrease the abruptness of the P-N junction and the transition between the opposite type conductivity regions. However, should a graded P-N junction be desired, a post-migration heat treatment may be practiced for a time sufficient to obtain the desired width of a graded P-N junction. Further, the planar regions 20 and 22 maximize the volume of the body 12 which can be utilized for functional electrical devices to a greater extent than can be achieved by prior art devices.

It has been discovered that one has to have a particular planar orientation of the surface of the body, a selected orientation of the direction of metal "wires" with respect to the planar orientation and to the axis of the crystal structure of the body along which migration of the "wires" is practiced. The term "wires" refers to wires formed by vapor deposition preferably, although other suitable means including solid wire, may be employed provided good wetting of the semiconductor material is achieved by the metal to be migrated.

With reference to FIG. 3, for the diamond cubic crystal structure of silicon, silicon carbide, germanium, and the like, P-N junction grids are only produced in bodies of semiconductor material having two particular orientations of the planar region of the surface. These selected planar regions are the (100) plane and the (111) plane. The (100) plane is that plane which passes through a pair of diagonally opposite edges of the unit cube. Those planes which pass through a corner atom and through a pair of diagonally opposite atoms located in a face not containing the first mentioned atoms are generally identified as (111) planes. As a matter of convenience, directions in the unit cube which are perpendicular to each of these general planes (X Y Z) are customarily referred to as the "crystal zone axis" of the particular planes involved, or more usually as the "< X Y Z > direction".

The crystal zone axis of the (100) generic plane will be referred to as the < 100 > direction and the crystal zone axis of the (111) plane as the < 111 > direction, and to the crystal zone axis of the (110) plane as the < 110 > direction. Examples of these directions with respect to the unit cube are shown by the appropriately identified arrows in FIG. 3. In particular, for the (100) planar orientation, metal-rich "wires" of material can only be migrated stably in a crystal lattice direction which is the < 100 > direction. In addition, only "wires" lying in the < 0$\bar{1}$1 > and the < 011 > directions are stable in migration in the < 100 > axis direction. The morphological shape of these stable metal-rich "wires" of material is shown in FIG. 4. Solid-liquid surface tension causes coarsening of the ends of the stable metal-rich liquid "wires".

Although lying in the same (100) planar region, "wires" of metal-rich liquid, which lay in directions other than the < 011 > and < 0$\bar{1}$0 > directions, are unstable and break up into a row of pyramidal square-base droplets of metal-rich liquid material because of severe faceting of the solid-liquid interface of wires lying in these directions. Thus, for example, "wires" lying in the < 012 > and < 02$\bar{1}$ > directions are unstable.

The dimensions of the metal "wires" also influence the stability of the metal "wires". Only metal "wires" which are no greater than 100 microns in width are stable during the migration of the "wires" in the < 100 > direction for a distance of at least on centimeter into the body of semiconductor material. Wire stability increases with decreasing "wire" size. The more the size of the liquid metal "wire" exceeds 100 microns, the less the distance that the liquid "wire" is able to penetrate the body during migration before the "wire" becomes unstable and breaks up.

A critical factor influencing the liquid metal "wire" stability during migration is the parallelism of the applied thermal gradient to either the < 100 >, < 110 > or < 111 > crystallographic directions. An off-axis component of the thermal gradient in general decreases the stability of the migrating liquid by causing tooth-like, or serrated facets to develop in the side faces of the "wire". When the tooth-like facets become too large, the "wire" breaks up and loses its continuity.

To fabricate the grid structure 10 of FIGS. 1 and 2 wherein the planar region is (100) and the migration direction is < 100 >, it is necessary to migrate a first array of liquid "wires" through the body 12 to form the regions 20 and then perform a second migration for a second array of liquid "wires" through the body 12 to form the second regions 22. Simultaneous migration of the liquid "wires" to form the regions 20 and 22 most often results in discontinuities in the grid structure. Investigation of the reasons for the discontinuities indicates that surface tension of the molten metal-rich material at the intersections of two migrating liquid "wires" is sufficiently great to cause discontinuities in the intersecting liquid "wires". Apparently, the solid-liquid surface tension is sufficient for each portion of the intersecting migrating "wires" to cause the metal-rich liquid to remain with its own "wire" portion instead of being distributed uniformly throughout the intersection of the "wires" in the body 12. As a result, material of the body 12 at the advancing interface of the supposedly intersecting liquid wires does not become wetted by the liquid "wires" or even contacted by the liquid and therefore is not dissolved into the advancing metal-rich liquid. Therefore, discontinuity occurs at the intersection and further advancement of the liquid "wires" produces an imperfect grid. In instances where the discontinuity of the grid is present, mutually adjacent regions 24 are not electrically isolated from each other and may deleterious affect the reliability of electrical circuitry associated therewith.

The stability of "wires" lying in a (111) plane for the surface 14 and migrating in a < 111 > direction through the body 12 to the surface 16 is not generally sensitive to the crystallographic direction of the "wire". This general stability of wires lying in the (111) plane results from the fact that the (111) plane is the facet plane for the metal-rich liquid-semiconductor system. The morphological shape of a "wire" in the (111) plane is shown in FIG. 5 and the top and bottom surfaces are in the (111) plane. Therefore, both the forward and the rear faces of these "wires" are stable provided the wire does not exceed a preferred width.

The side faces of a "wire" lying in the (111) plane are not as equally as stable as the top and bottom surfaces. Edges of the side faces lying in < 1$\bar{1}$0 >, < 10$\bar{1}$ > and the < 01$\bar{1}$ > directions have (111) type planes as side faces. Consequently, these "wires" are stable to any sideways drift that may be generated should the thermal gradient be not substantially aligned along the < 111 > axis. Other "wire" directions in the (111) plane such, for example, as the < 11$\bar{2}$ > type "wire" directions develop serrations on their side faces if they drift sideways as a result of a slightly off axis thermal gradient. Eventually, the continuing migrating "wire" breaks up completely or bends into a < 1$\bar{1}$0 > type line direction. Therefore, a reasonably well aligned thermal gradient permits thermal migration of < 11$\bar{2}$ > type direction "wires" through at least bodies of semiconductor material one centimeter in thickness by the temperature gradient zone melting process without either breaking up of the "wire" or serrations of the edges of the migrating wire occurring.

In thermal migrating liquid "wires" through bodies of semiconductor material having an initial (111) wafer plane, the most stable "wire" directions are < 01$\bar{1}$ >, < 10$\bar{1}$ > and < 1$\bar{1}$0 >. The width of each of these "wires" may be up to approximately 500 microns and still maintain stability during thermal migration. A triangular grid 50, as shown in FIG. 8, comprising a plurality of "wires" lying in the three "wire" directions < 01$\bar{1}$ >, < 10$\bar{1}$ > and < 1$\bar{1}$0 > is not readily obtainable by thermal migration embodying the temperature gradient zone melting (TGZM) process of all three "wires" simultaneously. The surface tension of the melt of metal-rich semiconductor material at the intersection of the three "wires" directions is sufficient to disrupt the line directions and result in an interruption of the grid structure. The grid, therefore, is preferably achieved by three separate TGZM processes embodying liquid "wire" migration of one "wire" direction at a time. The resulting structure as shown comprises the body 52 of semiconductor material having a first type conductivity and a selective level of resistivity having a top surface 54 and planar isolation regions 56, 58, and 60 wherein the material of each is recrystallized semiconductor material having a solid solubility of a dopant metal therein to impart a second and opposite type conductivity and a selective level of resistivity thereto. P-N junctions 62, 64 and 66 are formed by the contiguous surfaces of the material of the body 52 and the respective regions 56, 58 and 60.

"Wires" of a $<11\bar{2}>$, $<\bar{2}11>$ and $<1\bar{2}1>$ direction are less stable than the $<01\bar{1}>$, $<\bar{1}01>$ and $<1\bar{1}0>$ "wire" directions during thermal migration but more stable than any other "wire" directions in the (111) plane. The "wires" may have a width of up to 500 microns and still maintain their stability during thermal migration.

Any other "wire" direction in the (111) plane not disclosed heretofore may be migrated through the body of semiconductor material. However, the wires of these wire directions have the least stability of all the wire directions of the (111) plane in the presence of an off axis thermal gradient. Wires of a width up to 500 microns are stable during migration for all wires lying in the (111) plane regardless of wire direction.

The perpendicular P-N junction isolation grid of FIGS. 1 and 2, or of any other configuration of intersecting planar regions, may be fabricated by the simultaneous migration of one of the wire directions $<01\bar{1}>$, $<\bar{1}01>$ and $<1\bar{1}0>$ and one of any of the remaining wire directions. Alternatively, the grid may be produced by migrating each wire direction separately.

A summation of the stable "wire" directions for a particular planar direction and the stable "wire" sizes are tabulated in the following Table:

| Wafer Plane | Migration Direction | Stable Wire Directions | Stable Wire Sizes |
|---|---|---|---|
| (100) | $<100>$ | $<011>*$ | $< 100$ microns |
|  |  | $<0\bar{1}1>*$ | $< 100$ microns |
| (110) | $<110>$ | $<1\bar{1}0>*$ | $< 150$ microns |
| (111) | $<111>$ | a) $<01\bar{1}>$ |  |
|  |  | $<\bar{1}01>$ | $< 500$ microns |
|  |  | $<1\bar{1}0>$ |  |
|  |  | b) $<11\bar{2}>$ |  |
|  |  | $<\bar{2}11>$ | $< 500$ microns |
|  |  | $<1\bar{2}1>$ |  |
|  |  | c) Any other* Direction in (111) plane | $< 500$ microns |

*The stability of the migrating wire is sensitive to the alignment of the thermal gradient with the $<100>$, $<110>$ and $<111>$ axis, respectively.
Group a is more stable than group b which is more stable than group c.

The following example illustrates the teachings of this invention:

A body of a single crystal of silicon semiconductor material one inch in diameter, N-type, 10 ohm-centimeter resistivity, one centimeter in thickness of $<100>$ axial orientation was lapped and polished. A layer of silicon oxide was grown on the (100) planar surface. A square grid of line-array windows, 500 microns apart, and 50 microns each in width, were selectively etched in the silicon oxide employing photolithiographic techniques well known to those skilled in the art and aligned with the $<0\bar{1}1>$ and $<011>$ "wire" directions. The line array was then etched through the silicon surface to a depth of 20 microns. A 20 micron-thick aluminum film was deposited from an electron beam source into the line array etched in the silicon. The excess aluminum overlying the oxide mask was ground off leaving etched line array grooves filled with aluminum to form the "wires" for migration. The processed body of silicon was placed in an electron beam thermal migration apparatus designed to produce a very uniform vertical temperature gradient. A thermal gradient of 50°C per centimeter at 1200°C at a pressure of $1 \times 10^{-5}$ torr was employed to migrate the aluminum "wires" through the body. The excess aluminum was removed from the exit side of the body.

The entrance and exit surfaces of the body of silicon were polished and chemically stained by a solution of 33 parts HF, 66 parts $HNO_3$, 400 parts acetic acid and 1 part saturated $CuNO_3$ water solution by volume to reveal the P-type grid structure on both surfaces. The grid was well defined on both surfaces. There were no discontinuities in the grid. Electrical tests revealed the regions 24 were electrically isolated from each other. The regions 20 and 24 had a uniform resistivity of $8 \times 10^{-3}$ ohm-centimeter. The P-N junctions 27 and 26 had a breakdown voltage of 600 volts.

The processed body was sectioned to study the migration of the wires through the body at various depths. After polishing and chemical staining of the surfaces of the sections of the body, the grid structure was clearly defined on the entrance and exit surfaces of each section of the body. The grid was continuous throughout. The regions 24 were electrically isolated from each other. In addition, no appreciable changes were detected in the electrical characteristics of the regions 20 and 22 and the P-N junctions 27 and 26.

In addition to the preferred wire directions for the different planar orientations, we have discovered that any wire direction for the three planar orientations will migrate satisfactorily through a thin body of semiconductor material. The thin body preferably should not be greater than three or four times the preferred thickness of the layer of metal deposited on the surface of the body for the thermomigration therethrough. Therefore, for the migration of aluminum through a thin body of silicon, the body should not be greater than approximately 100 microns in thickness.

In addition, thicker wires than the ones disclosed in the table as being preferred, may be migrated through a thin body of semiconductor material. It has been found that metal wires may be migrated through a body of semiconductor material which has a thickness of from 3 to 4 times the thickness of the actual wire migrated therethrough. It has also been discovered that the migration of these metal wires may be practiced successfully because the wires do not have the sufficient distance of travel necessary before break up of the liquid wire can occur.

The electrical isolation cells shown and described so far are illustrative of cells where ohmic electrical contacts can be affixed to both major surfaces of the initial body of semiconductor material as may be required. Therefore, semiconductor devices incorporated in each cell may be contacted from both surfaces.

Alternately, if complete electrical isolation is required for each cell some means must be provided to accomplish the same.

Figure 9:
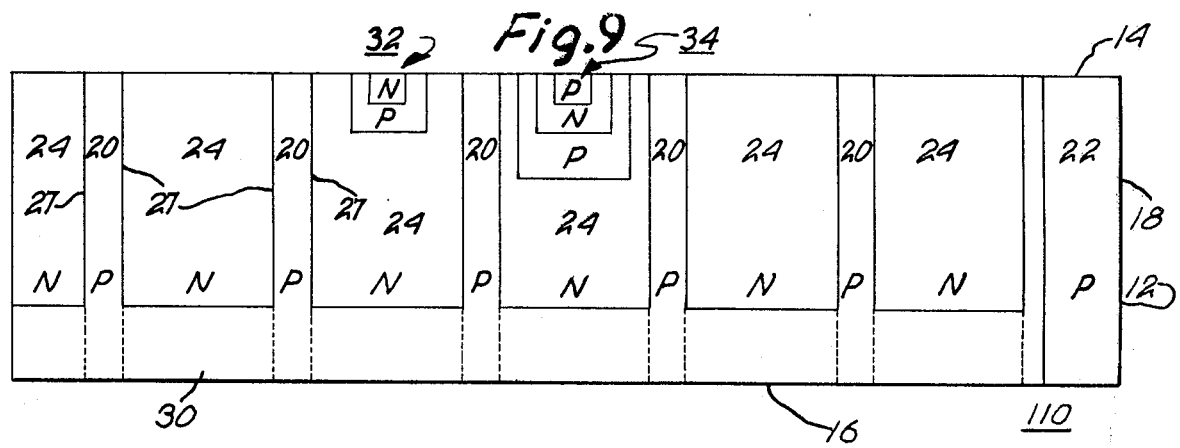
FIGS. 9 and 10 are each an elevation view, in cross-section, of an alternate embodiment of the device of FIGS. 1 and 2.

Referring not to FIG. 9, there is shown a device 110 which is an alternate embodiment of the device 10 of FIGS. 1 and 2. Each cell is electrically isolated from each other and from any mount affixed to the bottom surface 16 of the device 110. All items denoted by the same reference numeral as used in describing the device 10 are the same as, and function in the same manner, as the same items of FIGS. 1 and 2.

A region 30 of the same type conductivity as the regions 20 and 22 of the device is formed in the device 110 and is substantially parallel to the opposed surfaces 14 and 16. The surface 16 of the 110 is also the surface of the region 30. The region 30 may be formed by any suitable means known to those skilled in the semiconductor processing art such, for example, as by diffusion, epitaxial growth, and the like. Preferably, the region 30 is formed prior to the formation of the regions 20 and 22. The thermal gradient zone melting process is a very short timewise process to practice when compared to time required for diffusion and epitaxial growth processes. Therefore, the regions 20 and 24 may also be formed after the formation of semiconductor devices in the individual cells such, for example, as after the formation of diode 32 or transistor 34. Although practiced at elevated temperatures of from 400°C to 1400°C, the TGZM process has little effect on the previously formed P-N junctions.

Figure 10:
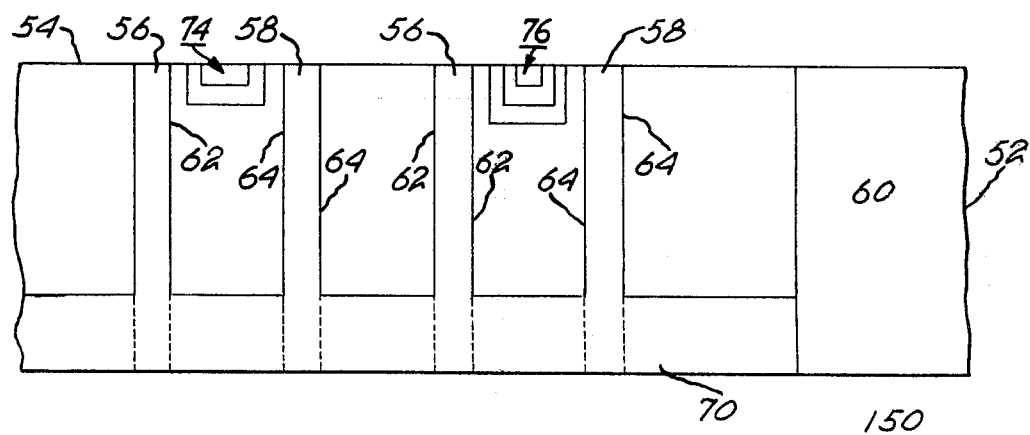
Figure 6:
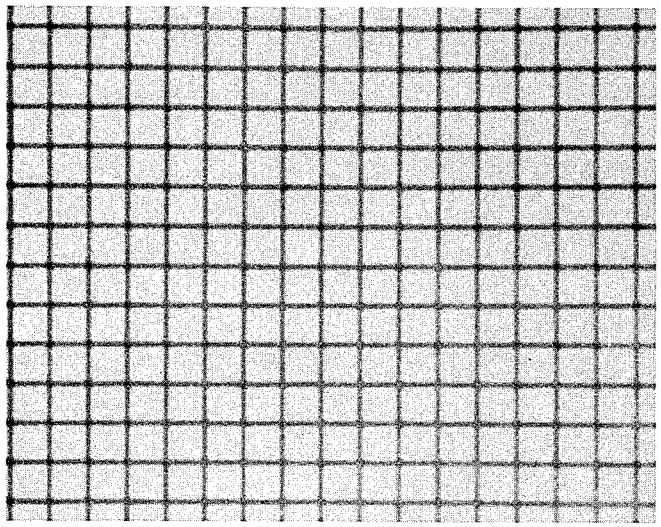
FIG. 6 is a top planar view of a grid on the entrance surface of a body of silicon processed in accordance with the teachings of this invention.
Figure 7:
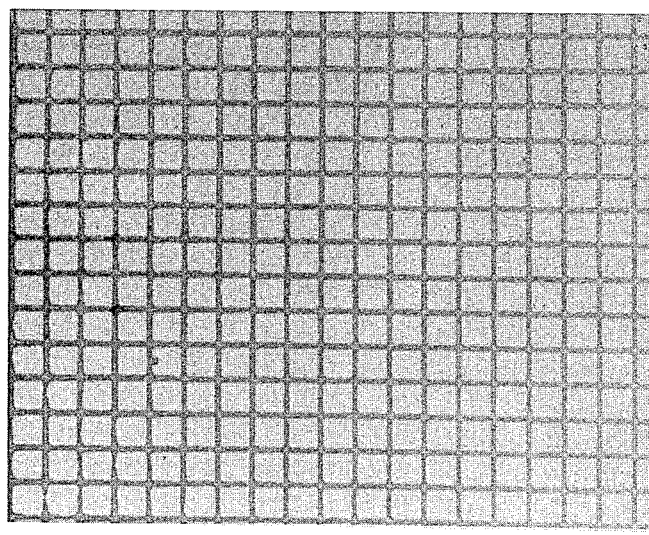
FIG. 7 is a bottom planar view of a grid on the exit surface of a body of silicon processed in accordance with the teachings of this invention.

With reference to FIG. 10, there is shown a device 150 which is an alternate embodiment of the device 50. All items denoted by the same reference numerals in FIG. 10 which are the same as those of FIG. 8 are the same, and function in the same manner, as previously described. A region 70 of the same type conductivity as that of the regions 56, 58, and 60 is formed in the bottom portion of the body 52 by diffusion through the bottom surface 72, or grown on the surface 72 by an epitaxial growth technique and the like. Preferably, the region 70 is formed prior to the regions 56, 58 and 60, the reasons being the same as described heretofore relative to the formation of the region 30 in the device 30. A planar diode 74, a planar transistor 76, and the like, may be formed in the individual completely electrically isolated cells. All electrical contacts to the devices may then be made from the top surface of the device 150.

We claim as our invention:

1. A method for making a grid arrangement in a body of semiconductor material of a semiconductor device to produce a plurality of regions of semiconductor material of the body electrically isolated from one another, the method comprising
   a. selecting a body of single crystal semiconductor material having a preferred crystallographic structure, two major opposed surfaces being respectively the top and botton surfaces thereof, a preferred planar orientation of at least the top surface, a first selected type conductivity, a selected level of resistivity and having a vertical axis substantially aligned with a first axis of the crystal structure which is substantially perpendicular to the selected surface of the body;
   b. forming a first region of second type conductivity in the body substantially parallel to the two major opposed surfaces and having a major surface coextensive with the bottom surface thereof;
   c. disposing a first array of metal wires on the selected major surface having the preferred planar orientation, the metal comprising at least one dopant material, the direction of the metal wires being oriented substantially aligned with at least one of the other axes of the crystal structure;
   d. heating the body and the first array of metal wires to a preselected elevated temperature sufficient to form an array of liquid wires of metal-rich semiconductor material on the body;
   e. establishing a temperature gradient substantially parallel to the vertical axis of the body and the first axis of the crystal structure, the surface on which the liquid wires are formed being at the lower temperature;
   f. migrating the first array of liquid wires through the body from one major opposed surface to the other major opposed surface substantially aligned with the axis of the body and the first axis of the crystal structure to at least intersect with the first region and to form a plurality of first planar regions of recrystallized semiconductor material of the body having solid solubility of the dopant material of the wire therein to provide a substantially uniform level of resistivity throughout the entire region which imparts a second type conductivity thereto, each first planar region being integral with the first region;
   g. disposing a second array of metal wires on the selected top surface of the body, the metal of the wire comprising at least one dopant, material, each of the metal wires having a second preferred wire direction which is oriented substantially aligned with a second different axis of the crystal structure and at a first preselected angle to the first stable wire direction;
   h. heating the body and the second array of metal wires to an elevated temperature sufficient to form an array of liquid wires of metal-rich semiconductor material on the top surface;
   i. establishing a temperature gradient substantially parallel to the vertical axis of the body and the first axis of the crystal structure, the top surface being at the lower temperature; and
   j. migrating the second array of liquid wires through the body from the top to the bottom surface substantially aligned with the vertical axis of the body and the first axis of the crystal structure to at least intersect with the first region and to form a plurality of second planar regions each of which intersects and is integral with the first region and at least one of the plurality of first planar regions, the material of the second planar regions comprising recrystallized semiconductor material of the body having solid solubility of at least the dopant metal of the wire therein to provide a substantially uniform level of resistivity throughout the entire region which imparts a second type conductivity thereto, thereby forming a plurality of unit cells of semiconductor material of the initial body electrically isolated from each mutually adjacent cell and from the bottom major surface of a composite which includes the body of semiconductor material and the first region.

2. The method of claims wherein
   the semiconductor material of the body is one selected from the group consisting of silicon, silicon carbide and germanium.

3. The method of claim 2 wherein
the semiconductor material is silicon having N-type conductivity, and
the dopant material of the liquid wire is aluminum.
4. The method of claim 1 wherein
the preferred planar orientation of at least the top surface is one selected from the group consisting of (100) and (111).
5. The method of claim 4 wherein
the preferred planar crystal orientation is (100),
the metal wires of the first array are oriented in a < 011 > stable wire direction and the metal wires of the second array are oriented in a < 0$\bar{1}$1 > stable wire direction, and
the first axis along which migration is practiced is < 100 >.
6. The method of claim 5 wherein
the semiconductor material of the body is one selected from the group consisting of silicon, silicon carbide and germanium.
7. The method of claim 6 wherein
the semiconductor material is silicon having N-type conductivity, and
the dopant material of the liquid wire is aluminum.
8. The method of claim 5 wherein
the first and second array of liquid metal wires are migrated simultaneously through the body of semiconductor material.
9. The method of claim 8 wherein
the semiconductor material of the body is silicon having N-type conductivity, and
the dopant material of the liquid metal is aluminum.
10. The method of claim 4 wherein
the preferred planar crystal orientation is (111);
the metal wires of the first array are oriented in any of the stable wire directions;
the metal wires of the second array are oriented in any stable wire direction other than that of the stable wire direction orientation of the metal wires of the first array, and
the direction of the first axis along which migration is practiced is < 111 >.
11. The method of claim 10 wherein
the semiconductor material of the body is one selected from the group consisting of silicon, silicon carbide and germanium.
12. The method of claim 11 wherein
the semiconductor material of the body is silicon having N-type conductivity, and
the dopant metal of the liquid metal wires is aluminum.
13. The method of claim 10 wherein
the first and second arrays of liquid metal wires are migrated simultaneously through the body of semiconductor material.
14. The method of claim 13 wherein
the material of the body is silicon having N-type conductivity, and
the dopant material of the liquid metal wires is aluminum.
15. The method of claim 10 wherein
each of the second planar regions is substantially perpendicular to, intersect and are integral with the plurality of first planar regions.
16. The method of claim 10 wherein
the metal wires of the first array are oriented in a preferred stable wire direction which is one selected from the group consisting of < 01$\bar{1}$ >, < 10$\bar{1}$ > and < 1$\bar{1}$0 >.
17. The method of claim 16 wherein
the semiconductor material of the body is one selected from the group consisting of silicon, silicon carbide and germanium.
18. The method of claim 17 wherein
the semiconductor material of the body is silicon having N-type conductivity, and
the dopant metal of the liquid metal wires is aluminum.
19. The method of claim 16 wherein
the first and second arrays of liquid metal wires are migrated simultaneously through the body of semiconductor material.
20. The method of claim 19 wherein
the material of the body is silicon having N-type conductivity, and
the dopant material of the liquid metal wire is aluminum.
21. The method of claim 16 wherein
each of the second planar regions is substantially perpendicular to the plurality of first planar regions and intersects at least one of the first planar regions.
22. The method of claim 10 wherein
the metal wires of the first array are oriented in a preferred stable wire direction which is one selected from the group consisting of < 11$\bar{2}$ >, < $\bar{2}$11 > and < 1$\bar{2}$1 >.
23. The method of claim 22 wherein
the semiconductor material of the body is one selected from the group consisting of silicon, silicon carbide and germanium.
24. The method of claim 23 wherein
the semiconductor material of the body is silicon having N-type conductivity, and
the dopant metal of the liquid metal wires is aluminum.
25. The method of claim 22 wherein
the first and second arrays of liquid metal wires are migrated simultaneously through the body of semiconductor material.
26. The method of claim 25 wherein
the material of the body is silicon having N-type conductivity, and
the dopant material of the liquid metal wires is aluminum.
27. The method of claim 22 wherein
each of the second planar regions of substantially perpendicular to the plurality of first planar regions.
28. The method of claim 1 including practicing the additional process steps after the migrating of the two arrays of liquid metal wires of:
disposing a third array of metal wires on the selected surface of the body of semiconductor material, each of the metal wires comprising at least one dopant material and being aligned with another axis of the crystal structure and in a stable wire direction which is at a preselected angle to each of the wires of the first and second arrays;
heating the body and the third array of metal wires to an elevated temperature sufficient to form an array of liquid wires of metal-rich semiconductor material on the selected top surface of the body;

establishing a temperature gradient substantially parallel to the vertical axis of the body, the selected top surface being at the lower temperature, and migrating the third array of metal-rich liquid wires through the body and the first region from the top to the bottom surface substantially aligned with the vertical axis of the body and the first axis of the crystal structure to form a plurality of third planar regions of recrystallized semiconductor material of the body having solid solubility of the metal of the wire wherein each of the third regions intersect and is integral with at least one of the first planar regions and at least one of the second planar regions.

29. The method of claim 28 wherein the preferred planar orientation of the selected surface is (111);

the preferred wire direction is any suitable stable wire direction other than that stable wire direction of each of the wires of the first and second arrays, and the first axis along which migration is practiced is $< 111 >$.

30. The method of claim 29 wherein the semiconductor material of the body is one selected from the group consisting of silicon, silicon carbide and germanium.

31. The method of claim 30 wherein the semiconductor material of the body is silicon having N-type conductivity, and the dopant metal of the liquid metal wires is aluminum.

32. The method of claim 29 wherein the stable wire direction of the wires of the first array is $< 01\bar{1} >$;

the stable wire direction of the wires of the second array is $< 10\bar{1} >$; and the stable wire direction of the wires of the third array is $< 1\bar{1}0 >$.

33. The method of claim 32 wherein the semiconductor material of the body is one selected from the group consisting of silicon, silicon carbide and germanium.

34. The method of claim 33 wherein the semiconductor material of the body is silicon having N-type conductivity, and the dopant metal of the liquid metal wires is aluminum.

35. The method of claim 28 wherein forming of the first region is practiced by diffusion through one of the bottom surface of the body.

36. The method of claim 28 wherein forming of the first region is practiced by the epitaxial growing of a layer of semiconductor material on the bottom surface of the body.

37. The method of claim 27 wherein forming of the first region is practiced after completion of the migrating of all of the metal wires through the body.

38. The method of claim 28 including the process step prior to disposing each of the three arrays of metal wires on the selected surface of:

etching selectively the selected surfaces of the body having the preferred planar crystal structure orientation to form an array of lineal trough-like depressions in the surface in a preferred direction thereon.

39. The method of claim 38 wherein the preferred planar orientation of the selected surface is (111);

the preferred wire direction is any suitable stable wire direction other than that stable wire direction of each of the wires of the first and second arrays, and the first axis along which migration is practiced is $< 111 >$.

40. The method of claim 39 wherein selective etching of the selective surface is practiced to limit the width of each wire as it is migrated through the body to less than 500 microns.

41. The method of claim 38 wherein the first trough-like depressions are oriented in a $< 01\bar{1} >$ wire direction;

the second trough-like depressions are oriented in a $< 10\bar{1} >$ wire direction; and the third trough-like depressions are oriented in a $< 1\bar{1}0 >$ wire direction.

42. The method of claim 1 wherein forming of the first region is practiced by diffusion through one of the bottom surface of the body.

43. The method of claim 1 wherein forming of the first region is practiced by the epitaxial growing of a layer of semiconductor material on the bottom surface of the body.

44. The method of claim 1 wherein forming of the first region is practiced after completion of the migrating of all of the metal wires through the body.

45. The method of claim 1 including the process step prior to disposing each of the arrays of metal wires on the selected surface of:

etching selectively the selected surface of the body having the preferred planar crystal structure orientation to form an array of linear trough-like depressions in the surface in a preferred direction thereon.

46. The method of claim 45 wherein the preferred planar orientation of at least the top surface is (100), and selective etching of the top surface, as the selective surface, is practiced to limit the width of each wire as it is migrated through the body to less than 100 microns.

47. The method of claim 45 wherein the preferred planar orientation of at least the top surface is (111), and selective etching of the top surface, as the selective surface, is practiced to limit the width of each wire as it is migrated through the body to less than 500 microns.

* * * * *